(12) United States Patent
de Cremoux

(10) Patent No.: US 10,622,899 B1
(45) Date of Patent: Apr. 14, 2020

(54) POWER CONVERTER

(71) Applicant: Dialog Semiconductor (UK) Limited, London (GB)

(72) Inventor: Guillaume de Cremoux, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/256,370

(22) Filed: Jan. 24, 2019

(30) Foreign Application Priority Data

Dec. 13, 2018 (GB) .................................... 1820291.1

(51) Int. Cl.
    H02M 3/04 (2006.01)
    H02M 3/07 (2006.01)
    H02M 3/158 (2006.01)
    G01R 19/165 (2006.01)
    H03K 5/24 (2006.01)

(52) U.S. Cl.
    CPC .... H02M 3/1584 (2013.01); G01R 19/16528 (2013.01); H02M 3/073 (2013.01); H03K 5/24 (2013.01); *H02M 2003/077* (2013.01)

(58) Field of Classification Search
    CPC .............. H02M 3/1584; H02M 3/073; H02M 2003/077; H03K 5/24; G01R 19/16528
    See application file for complete search history.

(56) References Cited

U.S. PATENT DOCUMENTS

| | | | | |
|---|---|---|---|---|
| 5,767,735 A | * | 6/1998 | Javanifard | G11C 5/145 327/536 |
| 6,150,835 A | * | 11/2000 | Hazen | H03K 19/17748 326/38 |
| 6,657,876 B2 | * | 12/2003 | Satoh | H02J 7/0065 307/110 |
| 6,985,397 B2 | * | 1/2006 | Tokui | G11C 16/30 365/185.18 |
| 8,854,019 B1 | | 10/2014 | Levesque et al. | |
| 9,431,974 B2 | * | 8/2016 | Khlat | H03F 3/217 |
| 10,097,145 B1 | * | 10/2018 | Khlat | H03F 1/0211 |

(Continued)

OTHER PUBLICATIONS

"Multi-Level Conversion: High Voltage Choppers and Voltage-Source Inverters," by T.A. Meynard et al., 23rd Annual IEEE Power Electronics Specialists Conference, Jun. 29, 1992, pp. 397-403.

(Continued)

*Primary Examiner* — Kenneth B Wells
(74) *Attorney, Agent, or Firm* — Saile Ackerman LLC; Stephen B. Ackerman

(57) ABSTRACT

A power converter for providing an output voltage is presented. The power converter includes an inductor, a charge pump circuit and a controller. The charge pump circuit has a plurality of charge pumps; each charge pump being selectively coupled to the inductor via a coupling switch. Each charge pump is operable in at least three modes. Each mode is associated with a different conversion ratio. The controller is adapted to provide a first set of control signals to control the coupling switches; and a second set of control signals to operate the charge pump circuit. The second set of control signals is configured to operate a charge pump coupled to the inductor with a sequence of modes.

19 Claims, 8 Drawing Sheets

(56) References Cited

U.S. PATENT DOCUMENTS 10,148,171 B2 * 12/2018 Nguyen .............. H02M 3/07
2018/0175726 A1 6/2018 Petersen et al.

OTHER PUBLICATIONS

"Small Signal Modeling and Control Design for New Extended Duty Ratio, Interleaved Multiphase Synchronous Buck Converter," by Bradley Oraw et al., Intelec 06—Twenty-Eighth International Telecommunications Energy Conference, Sep. 10, 2006, 8 pages.

"A Simple Hybrid 3-Level Buck-Boost DC-DC Converter with Efficient PWM Regulation Scheme," by Abdullah Abdulslam et al., 2015 IEEE International Conference on Electronics, Circuits, and Systems (ICECS), Dec. 6, 2015, pp. 368-371.

Texas Instruments Application Report, SLVA750, Apr. 2016, "Introduction to the Series Capacitor Buck Converter," by Pradeep S. Shenoy, pp. 1-14.

"Mixed-Signal Controlled Hybrid Converter Topologies," by Aleksandar Prodic, IEEE Compel 2016, Laboratory for Power Management and Integrated SMPS, University of Toronto, Rogers ECE Department, pp. 1-71.

* cited by examiner

POWER CONVERTER

TECHNICAL FIELD

The present disclosure relates to a power converter and a method of operating the same. In particular, the present disclosure relates to a hybrid power converter, such as a hybrid boost converter, comprising a plurality of charge pumps selectively coupled to an inductor.

BACKGROUND

Electronics circuits including audio amplifiers demand relatively high input powers, which may be in excess of 20W or more. Conventional inductor converters can deliver such powers, however as the power capability of the converter increases, so does the size of the converter. For instance, the publication titled "Small signal modelling and control design for new extended duty ratio, interleaved multiphase synchronous buck converter", by Bradley Oraw and Rajapandian Ayyanar, published in the twenty-eight international telecommunications energy conference in September 2006, describes an extended duty-cycle buck converter. The extended duty-cycle buck converter has four phases and four inductors. The inductors carry a relatively high output current Iout. As such, the inductors must have a sufficient current rating, which increases their size.

SUMMARY

It is an object of the disclosure to address one or more of the above-mentioned limitations. According to a first aspect of the disclosure, there is provided a power converter for providing an output voltage; the power converter comprising an inductor; a charge pump circuit comprising a plurality of charge pumps; each charge pump being selectively coupled to the inductor via a coupling switch; and wherein each charge pump is operable in at least three modes, each mode being associated with a different conversion ratio; and a controller adapted to provide a first set of control signals to control the coupling switches; and a second set of control signals to operate the charge pump circuit, wherein the second set of control signals is configured to operate a charge pump coupled to the inductor with a sequence of modes.

Optionally, the controller may be adapted to compare the output voltage with a target value to define the sequence of modes. For example, the target value may be a pre-set value or a programmable value.

Optionally, the first set of control signals comprises a plurality of logic signals; each logic signal having a first logic state for coupling the charge pump to the inductor and a second logic state for disconnecting the charge pump from the inductor; wherein the first logic state lasts for a time duration. For example, the time duration may be a fraction of a period of the logic signal.

Optionally, each logic signal in the plurality of logic signals is delayed by a delay value. For example, a first logic signal may be delayed by 1 times the delay value, a second logic signal delayed by 2 times the delay value and an nth logic signal delayed by N times the delay value.

Optionally, the second set of control signals is adapted to operate the charge pump coupled to the inductor with the sequence of modes during the time duration.

Optionally, the second set of control signals is adapted to operate one or more charge pumps in a specific mode when the one or more charge pumps are not coupled to the inductor. For example, the specific mode may be a mode allowing to recharge capacitors present in the charge pump.

Optionally, the second set of control signals is configured to operate each charge pump, when coupled to the inductor, with the same sequence of modes.

Optionally, the logic signals in the first set of control signal have the same duty cycle and are shifted with respect to each other, such that a first logic state of a first logic signal overlaps partially with a first logic state of a second logic signal.

Optionally, the controller is adapted to generate an error signal by comparing the output voltage with the target value; to compare the error signal with a first reference signal and a second reference signal respectively; and to generate the second set of control signals based on the comparison.

Optionally, the first reference signal and the second reference signals have a triangular shape. For example, the triangular shape may be synchronised with the first state of the logic signal such that a triangular waveform is formed within a duration of the first state.

Optionally, the controller comprises an error amplifier for generating the error signal; a ramp generator configured to generate the first reference signal and the second reference signal; a first comparator adapted to compare the error signal with the first reference signal and to generate a first comparison signal; a second comparator adapted to compare the error signal with the second reference signal and to generate a second comparison signal; a decoder system coupled to the first and second comparators, the decoder system being configured to generate the second set of control signals based on the first comparison signal and the second comparison signal.

For example, the decoder system may comprise a plurality of decoders each decoder being configured to provide a set of signals for operating a corresponding charge pump.

Optionally, each mode in the sequence of modes lasts for a corresponding mode duration.

Optionally, the controller is a digital controller comprising a duration generator for calculating the mode durations associated with each mode in the sequence of modes.

Optionally, the charge pump circuit comprises a plurality of direct charge pumps or Dickson charge pumps.

Optionally, the charge pump circuit comprises at least three charge pumps coupled in parallel.

According to a second aspect of the disclosure, there is provided a method of providing an output voltage, the method comprising the steps of providing an inductor; providing a charge pump circuit comprising a plurality of charge pumps; each charge pump being selectively coupled to the inductor via a coupling switch; and wherein each charge pump is operable in at least three modes, each mode being associated with a different conversion ratio; and providing a first set of control signals to control the coupling switches; providing a second set of control signals to operate the charge pump circuit; wherein the second set of control signals is configured to operate a charge pump coupled to the inductor with a sequence of modes.

Optionally, the method comprises the step of comparing the output voltage with a target value to define the sequence of modes.

Optionally, the sequence of modes may be defined by a plurality of mode values to be applied at a certain time and for a certain duration.

Optionally, the second set of control signals is configured to operate each charge pump, when coupled to the inductor, with the same sequence of modes.

The options described with respect to the first aspect of the disclosure are also common to the second aspect of the disclosure.

BRIEF DESCRIPTION OF THE DRAWINGS

The disclosure is described in further detail below by way of example and with reference to the accompanying drawings, in which.

DESCRIPTION

Figure 1:
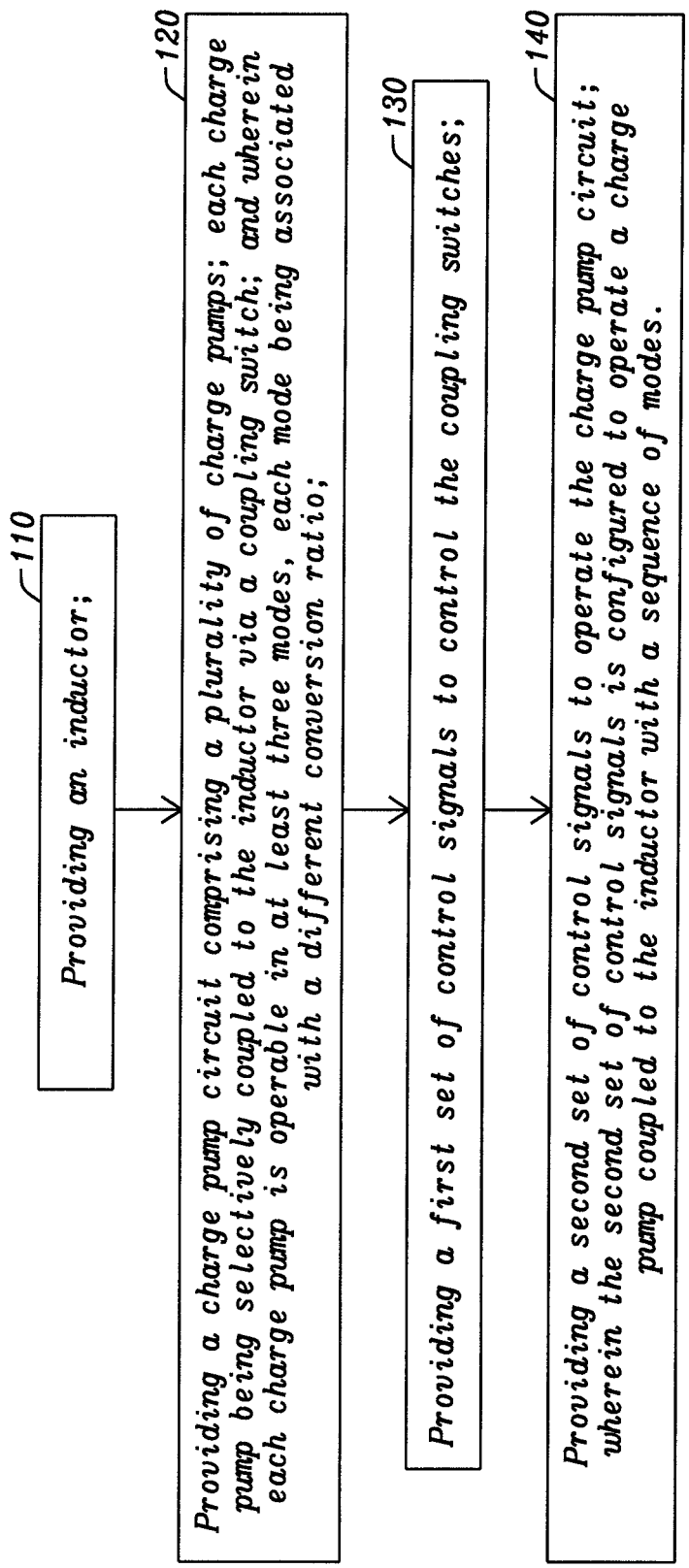
FIG. 1 is a flow chart of a method of providing an output voltage.

FIG. 1 illustrates a method of providing an output voltage to power an electronic circuit. At step 110 an inductor is provided. At step 120 a charge pump circuit comprising a plurality of charge pumps is provided. Each charge pump is selectively coupled to the inductor via a coupling switch and each charge pump is operable in at least three modes. The modes are associated with a-different conversion ratios. For instance, the modes may be 1X, 2X and 3X modes for converting a battery voltage by a factor one, two and three, respectively.

At step 130, a first set of control signals is provided to control the coupling switches. At step 140 a second set of control signals is provided to operate the charge pump circuit. The second set of control signals is configured to operate a charge pump coupled to the inductor with a sequence of modes.

Various sequences of modes may be used depending on the application and power need. For instance, a sequence of modes may include the modes 1X, 2X and 3X. A first sequence may be 1X, 2X, 1X; another sequence may be 1X, 2X, 3X, 2X, 1X; yet another sequence may be 2X, 3X, 2X.

The duration of each mode in the sequence of modes may also vary. For instance, a mode 1X may last for a duration T1; a mode 2X may last for a duration T2; and a mode 3X may last for a duration T3. The durations of each mode may vary depending on the application. So, a sequence of modes may be defined by a set of parameters that includes a sequence of modes and a duration associated with each mode in the sequence. For instance, a sequence may be {(1X,T1), (2X,T2), (1X,T1)} in which a charge pump is operated first with a 1X mode for a duration T1, then with a 2X mode for a duration T2, and then with the mode 1X for the duration T1.

Figure 2:
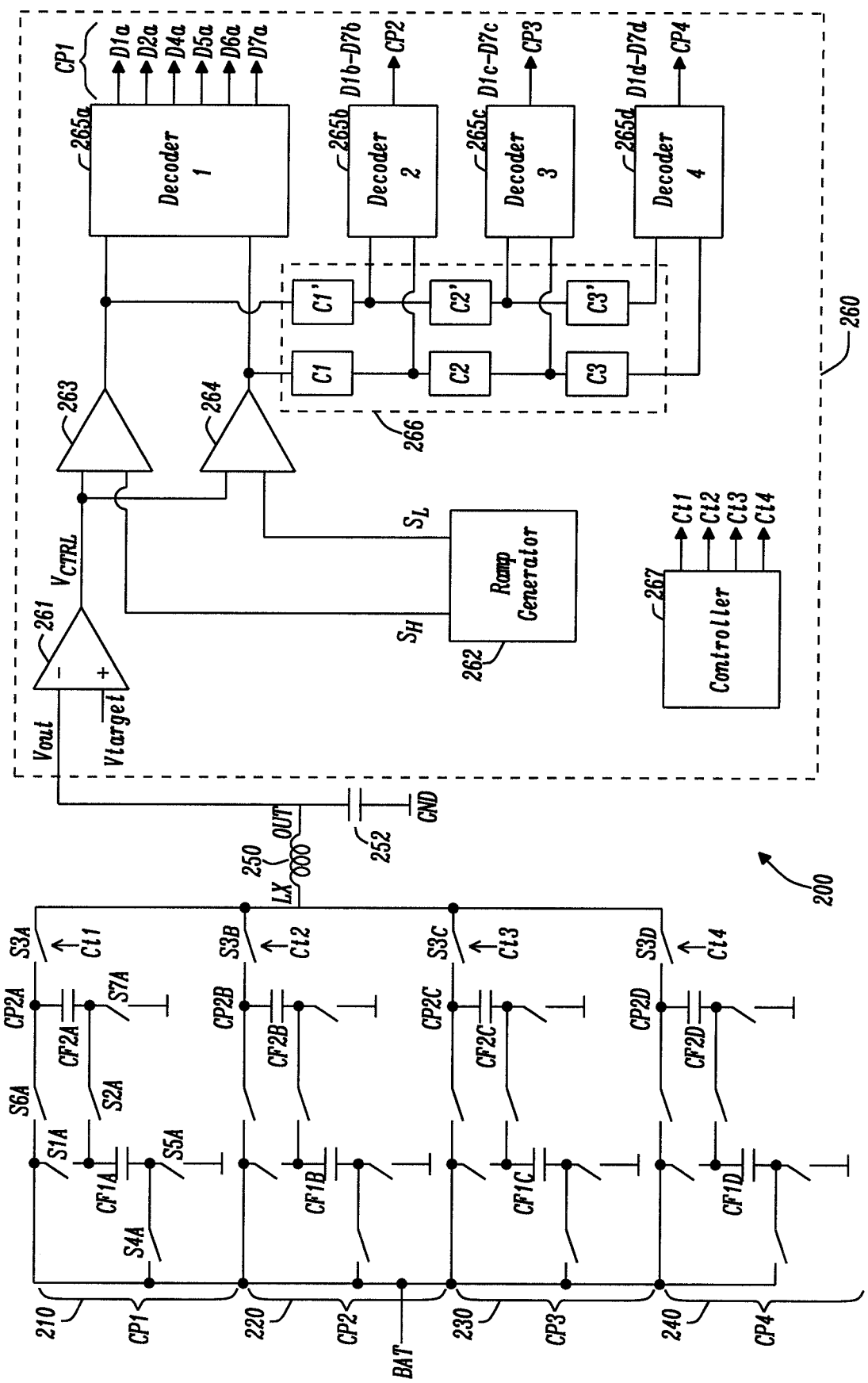
FIG. 2 is a diagram of a power converter for implementing the method of FIG. 1.

FIG. 2 illustrates a power converter 200 for implementing the method of FIG. 1. The power converter 200 includes a charge pump circuit formed by a plurality of charge pumps coupled in parallel between an input node for receiving an input voltage, for instance Vbat; and a switching node Lx. In this example, the charge pump circuit includes four charge pumps CP1 210, CP2 220, CP3 230, and CP4 240.

A single inductor 250 is provided between the switching node LX and an output node for providing an output voltage Vout. An output capacitor 252 may be provided between the output node and ground.

Each charge pump is coupled to the switching node Lx via a coupling switch. For instance, CP1 is coupled to LX via the coupling switch S3A; similarly, CP2 is coupled to LX via the coupling switch S3B; CP3 is coupled to LX via the coupling switch S3C; and CP4 is coupled to LX via the coupling switch S3D.

A controller system 260 is provided to control the operation of the power conversion circuit. The control system 260 includes a controller 267 adapted to provide a first set of control signals labelled Ct1, Ct2, Ct3 and Ct4 to control the coupling switches S3A, S3B, S3C and S3D, respectively.

Another portion of the controller circuit 260 is provided to generate a second set of control signals to operate each one of the charge pumps CP1, CP2, CP3 and CP4, respectively. This circuit portion includes an error amplifier 261, a ramp generator 262, a pair of comparators 263, 264, a decoder system that includes four decoders Decoder 1 265a, Decoder 2 265b, Decoder 3 265c and Decoder 4 265d, as well as a delay circuit 266 formed by a first chain of delay cells and a second chain of delay cells. The first chain includes cells C1, C2 and C3 coupled in series, and the second chain includes the cells C1', C2' and C3' coupled in series. Synchronisation circuitry, such as a clock or timer (not shown) is also provided to synchronise the controller 267 and the ramp generator 262.

The error amplifier 261 has a first input, for example an inverting input coupled to the output of the single inductor 250 and a second input, for example a non-inverting input for receiving a target voltage Vtarget. The target voltage Vtarget may be a set value or a programmable value.

The ramp generator 262 is configured to generate two reference signals labelled SH and SL having a triangular shape waveform. The first comparator 263 has a first input coupled to the output of the error amplifier 261 and a second input to receive the reference signal SH from the ramp generator 262. Similarly, the second comparator 264 has a first input coupled to the output of the error amplifier 261 and a second input for receiving the second reference signal SL.

The output of the first and second comparators are coupled to the decoder system. The decoder 1 265a has a first input for receiving the output of the first comparator 263; a second input for receiving the output of the second comparator 264, and six outputs for providing the signals D1a, D2a, D4a, D5a, D6a and D7a controlling the switches S1a, S2a, S4a, S5a, S6a and S7a respectively of the charge pump CP1. The second decoder 265b has a first input coupled to the output of the first comparator 263 via delay cell C1' and a second input coupled to the output of comparator 264 via delay cell C1. The decoder 265b has a plurality of outputs for providing signals D1b-D7b controlling the charge pump CP2. The third decoder 265c has a first input coupled to the output of the first comparator 263 via delay cells C1' and C2' and a second input coupled to the output of comparator 264 via delay cells C1 and C2. The decoder 265c has a plurality of outputs for providing signals D1c-D7c controlling the charge pump CP3. The fourth decoder 265d has a first input coupled to the output of the first comparator 263 via delay cells C1', C2' and C3' and a second input coupled to the output of comparator 264 via delay cells C1, C2 and C3. The decoder 265d has a plurality of outputs for providing signals D1d-D7d controlling the charge pump CP4.

Optionally, additional circuitry may be provided between the decoders 265a, 265b, 265c, 265d and the switches of the charge pumps CP1, CP2, CP3 and CP4 for performing a break before make operation. Such a circuitry can be used to prevent two switches from being turned on simultaneously.

It will be appreciated that the controller system 260 may be implemented in different fashions. For instance, the controller 260 may be implemented digitally.

The charge pumps CP1, CP2, CP3 and CP4 may be implemented in different fashions, however, the charge pump should be capable of operating in a plurality of modes, and preferably at least three modes, for instance 1 times the battery voltage, 2 times the battery voltage and 3 times the battery voltage. It will also be appreciated that the number of charge pumps may also vary. For instance, the number of charge pumps may be at least two, and may increase depending on the application. Using four charge pumps operating at a given frequency it is possible to obtain a relatively high switching frequency. For instance, using four charge pumps each operating at 1 MHz a switching frequency of 4 MHz can be achieved. This permits reducing the size of the DCDC inductor 250. The operation of the circuit 200 is described with reference to the FIGS. 3-6 below.

Figure 3:
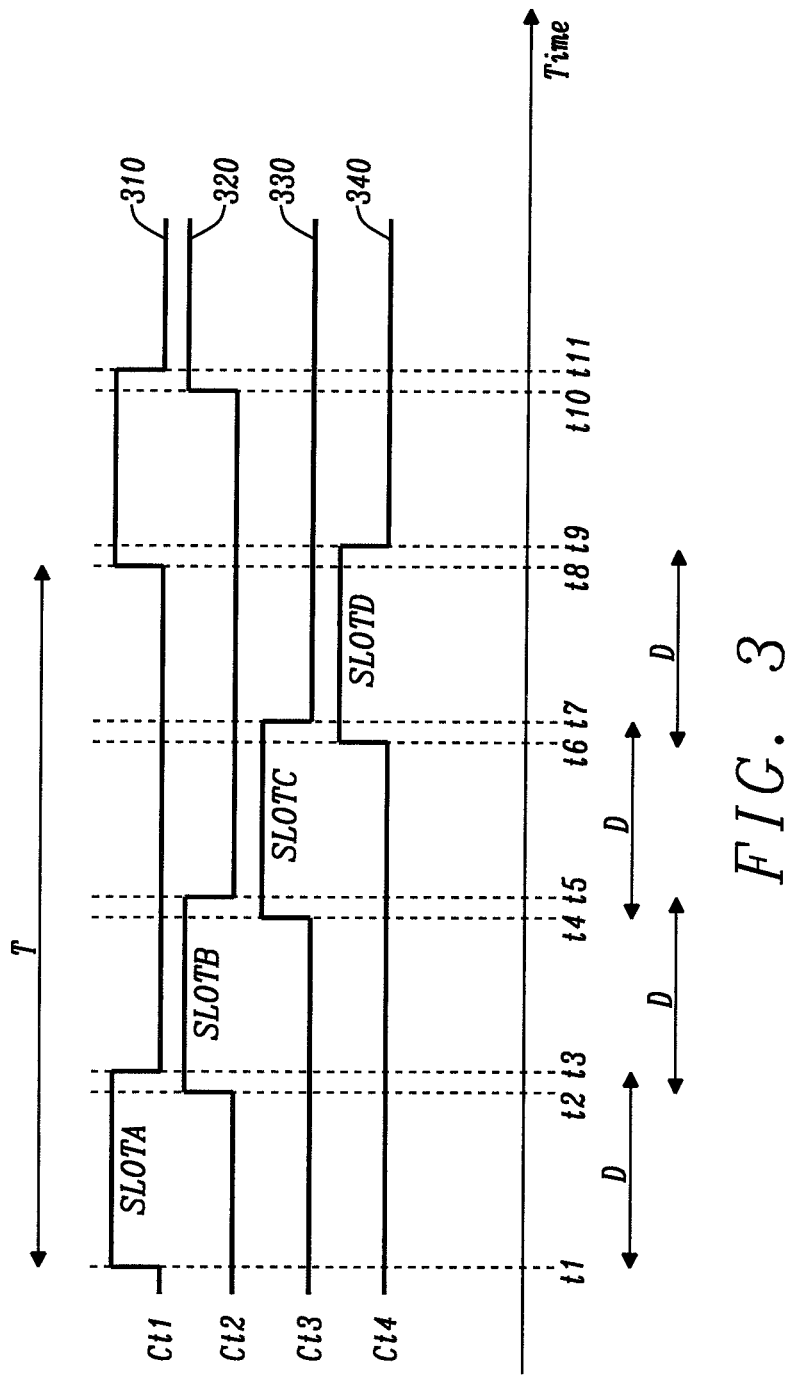
FIG. 3 is a time chart illustrating the working of the circuit of FIG. 2.

FIG. 3 illustrates a set of control signals provided by the controller 267. FIG. 3 shows the first control signal Ct1 310 for controlling the switch S3A, the second control signal Ct2 320 for controlling the switch S3B, the control signal Ct3 330 for controlling the switch S3C and the control signal Ct4 340 for controlling the switch S3D.

The control signals are logical signals varying between a high state and a low state. For each period T, a control signal has a high state value that lasts for a duration D referred to as slot; and a low state value that last for the remaining time available in the period. The control signal Ct1 has a high state window referred to as SLOTA. Similarly, the control signals Ct2, Ct3 and Ct4 have a high state window referred to as SLOTB, SLOTC and SLOTD, respectively.

When a control signal is in the high state, the coupling switch is switched on and therefore couples the charge pump to the single inductor 250.

In this example, the four control signals, Ct1, Ct2, Ct3 and Ct4 have the same period T. The SLOTA, SLOTB, SLOTC and SLOTD are shifted with respect to each other such that SLOTA arises before SLOTB, SLOTB arises before SLOTC and SLOTC arises before SLOTD. The slots may also overlap partially. For instance, in FIG. 3 the end region of SLOTA overlaps with the beginning region of SLOT B, and the end region of SLOTB overlaps with the beginning region of SLOT C, and so on. This overlap is used to prevent breaking the current path in the inductor, hence ensuring the provision of a continuous current flow.

Referring to the first control signal Ct1, at time t1 the signal goes from low to high and stays high until time t3, then the signal goes from high to low between t3 and time t8. A full period extends between the times t1 and t8. At the start of a new period at time t8 the signal goes from low to high and stays high until time t11. The duration D between the times t1 and t3 is the duration of the SLOTA. Turning to the second control signal Ct2, the signal is low between time t1 and t2. At time t2, the signal goes from low to high and stays high until time t5 and then low again between the times t5 and t10. Between the times t2 and t3, there is an overlap between the SLOTA of the first control signal and the SLOT B of the second control signal. During overlap, both charge pumps CP1 and CP2 are coupled to the single inductor 250.

Therefore, in operation, each charge pump is coupled to the single inductor sequentially, the first charge pump, then the second one, then the third one, then the fourth one. However, CP1 and CP2 are both coupled for a short time between t2 and t3 and then CP2 and CP3 are both coupled for a short time between t4 and t5 and then CP3 and CP4 are both coupled for a short time together between t6 and t7.

The SLOTS A-D may correspond to a quarter of the period T. For instance, if the period T is set to 1 µs, corresponding to a frequency of 1 MHz then each charge pump operates at 1 MHz.

During the duration D the charge pump delivers energy to the output and during the remaining time (T-D), the charge pump re-charges its capacitors. While one charge pump is used to deliver energy to the output via the switching node LX, the remaining three charge pumps are in reset mode. For instance, the remaining charge pumps may be reset by re-charging their internal capacitors. This may be achieved by operating the remaining charge pumps in the 1X mode.

Each charge pump may be operated using thea same sequence of modes. For instance, if during SLOTA CP1 is operated with a specific sequence of modes, then during SLOTB, CP2 is operated with the same specific sequence of modes. Similarly, during SLOTC and SLOTD, CP3 and CP4 are also operated using the same specific sequence of modes. If the frequency is 1 MHz, each charge-pump is switching at 1 MHz. However, the inductor sees a frequency of 4 MHz. This allows reducing the overall size of the power converter.

Figure 4:
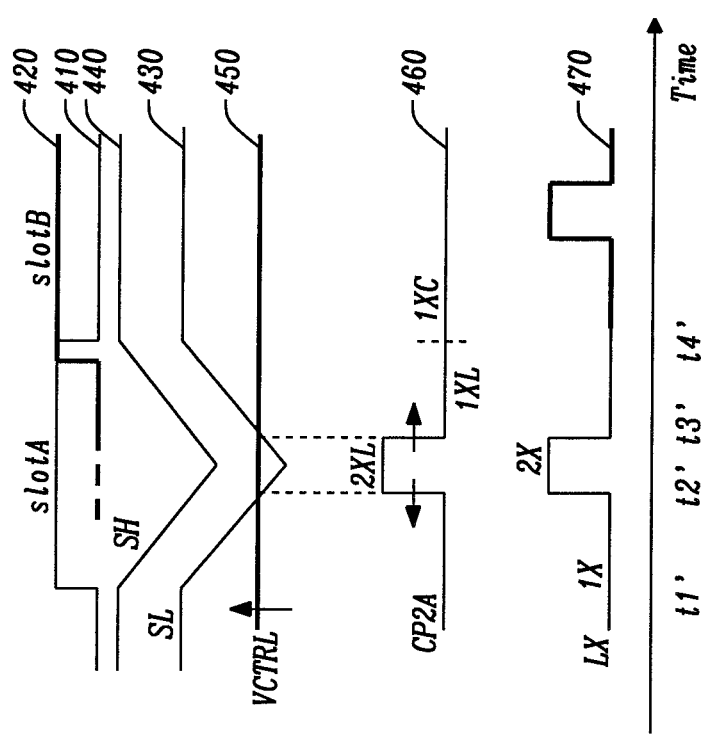
FIG. 4 is a time chart illustrating the operation of the circuit of FIG. 2 when delivering a relatively low output voltage.

FIG. 4 shows the first control signal Ct1 410, the second control signal Ct2 420, the first reference signal SL 430, the second reference signal SH 440, the error signal 450 provided by the error amplifier 261 also referred to as VCTRL, the voltage 460 at the output of the first charge pump CP1 and the voltage 470 at the switching node LX.

The reference signals SL and SH are synchronized on the high state of the control signal. In this example the reference signals SL 430 and SH 440 have a triangle waveform provided between the times t1' and t4' corresponding to the SLOTA of the first control signal 410.

The reference signals SL and SH have both have a triangular waveform. Before time t1' a reference signal, for example SL is constant. At time t11 the reference signal starts decreasing until a time t1'+D/2. Then the reference signal increases back to its constant value at time t4'. The amplitudes of the reference signals are shifted with respect to each other such that SL has a lower value than SH.

Before the time t2' the error signal VCTRL 450 is lower than both SL and SH. As a result, CP1 is operated in mode 1X. Between the times t2' and t3' the error signal 450 is greater than SL 430, but lower than SH. As a result, CP1 is operated in mode 2X. Between the times t'3 and t4', the error signal 450 is lower than both 430 and 440. As a result, CP1 is operated in mode 1X. Therefore, between times t1' and t4' the charge pump CP1 is operated using a sequence of modes defined by 1X VBAT, 2X VBAT and then again 1X VBAT. The duration of the mode 1X is t2'-t1' and the duration of the mode 2X is t3'-t2'.

Figure 5:
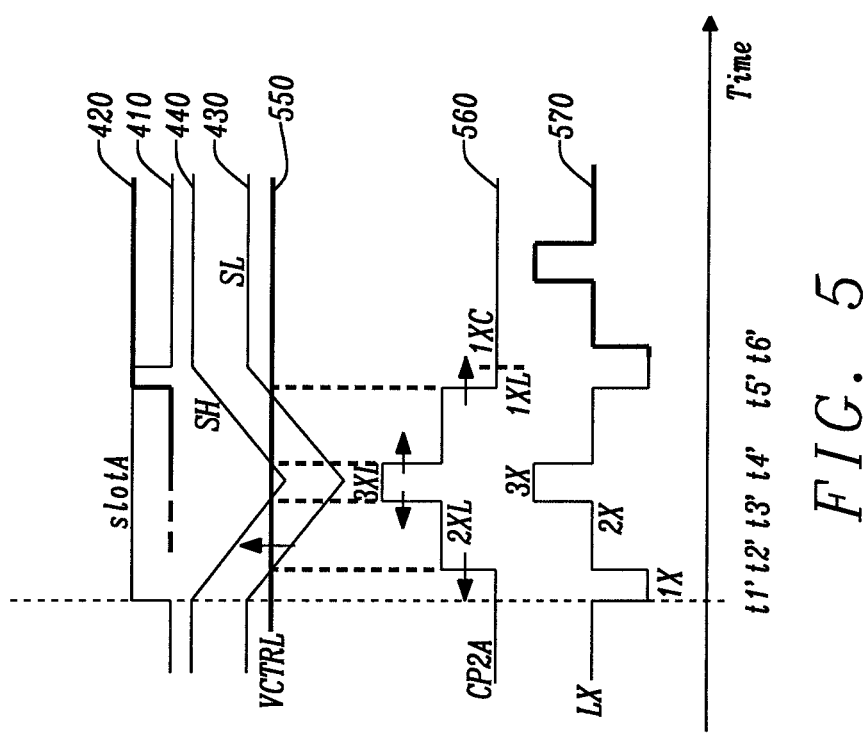
FIG. 5 is a time chart illustrating the operation of the circuit of FIG. 2 when delivering a medium output voltage.

FIG. 5 illustrates another sequence of operations for controlling a charge pump connected to the single inductor. FIG. 5 shows the first control signal Ct1 410, the second control signal Ct2 420, the first reference signal SL 430, the second reference signal SH 440, the error signal 550, the voltage 560 at the output of the first charge pump CP1 and the voltage 570 at the switching node LX.

In this case, the voltage control or error signal 550 is now greater than in the previous example of FIG. 4. The SLOTA has a duration D between the times t1' and t5'. Between the times t1' and t2' the error signal 550 is lower than both reference signals SH and SL and the charge pump is operated in the 1X mode. Between the times t2' and t3' the error signal 550 is greater than SL 430, but lower than SH 440 and the charge pump is operated in the 2X mode. Between the times t3' and t4', the control signal 550 is greater than both SL and SH, and the charge pump is operated in the 3X mode. Between the times t4' and t5' the error signal 550 is lower than SH but greater than SL and the charge pump is operated in the 2X mode. Between the times t5' and t6' the error signal 550 is lower than both SH and SL and the charge pump is operated in the 1X mode. Therefore, in this example the sequence of modes is 1X, 2X, 3X, 2X, 1X. The duration of the 1X mode is defined by t2'–t1'. The duration of the 2X mode is defined by t3'–t2' and the duration of the 3X mode is defined by t4'–t3'.

Figure 6:
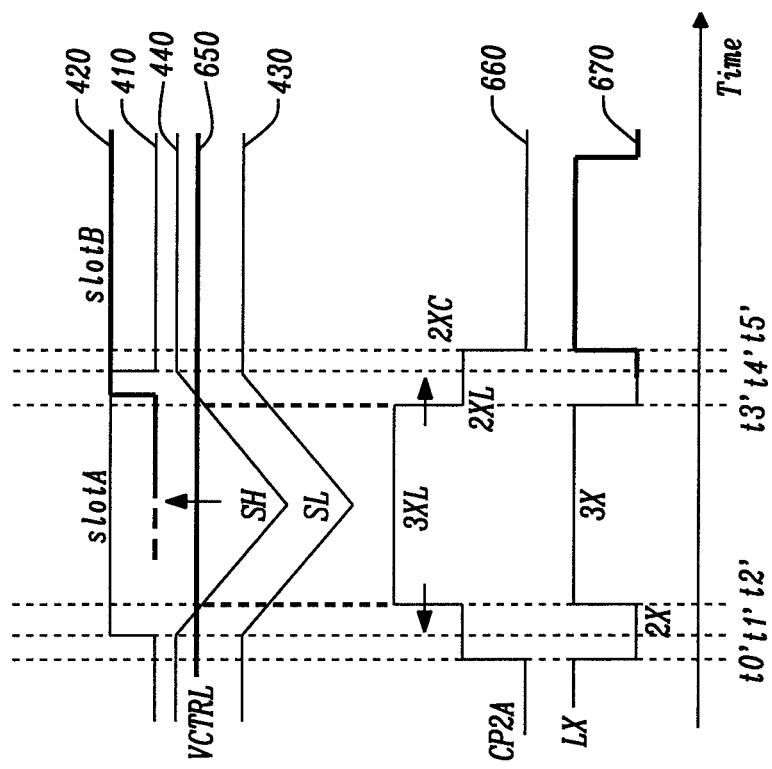
FIG. 6 is a time chart illustrating the operation of the circuit of FIG. 2 when delivering a relatively high output voltage.

FIG. 6 illustrates yet another sequence of operations. FIG. 6 shows the first control signal Ct1 410, the second control signal Ct2 420, the first reference signal SL 430, the second reference signal SH 440, the error signal 650, the voltage 660 at the output of the first charge pump CP1 and the voltage 670 at the switching node LX.

In this case, the voltage control or error signal 650 is greater than in the previous example of FIG. 5. The SLOTA has a duration D between the times t1' and t4'. Before a time t0 the error signal 650 is greater than SL and lower than SH and the charge pump is operated in the 1X mode. At time t0 the charge pump is operated in the 2X mode. Between the times t0 and t2', the error signal 650 remains greater than SL and lower than SH, and the charge pump is operated in the 2 times mode. So, at time t1' the charge pump already operates in the 2X mode. Between the times t2' and t3' the control signal 650 is greater than both SL and SH and the charge pump is operated in the 3X mode. Between the times t3' and t5', the error signal 650 is lower than SH but greater than SL and the charge pump is operated in the 2X mode. So, at time t4' the charge pump is still operating in the 2X mode. At time t5' the charge pump is operated in the 1X mode. Therefore, in this example, the sequence of modes is 2X, 3X, 2X. The duration of the 2X mode is defined by t2'–t0 and the duration of the 3X mode is defined by t3'–t2'. In this case the duration of the 3X mode is greater than in the example of FIG. 5. This allows delivering more power.

In the examples described with reference to FIGS. 4 to 6 the charge pump may be operated using the 1X mode on the falling edge of the slot, or shortly after, to recharge the flying capacitors of the charge pump during the remaining time of the period.

Using the proposed approach, the voltage swing across the inductor can be reduced. As a result, the inductance of the inductor 250 may be relatively low. Compared to other hybrid converter topologies, the inductor drives only the output current Iout as opposed to 3X or 4X Iout. This allows using a smaller inductor. The inductor sees a modulation of the switching node at relatively high frequency. In the above example, the modulation of the switching node is at 4 MHz. This is higher than the frequency of 1.5 MHz typically found in conventional inductive boost circuits.

Figure 7:
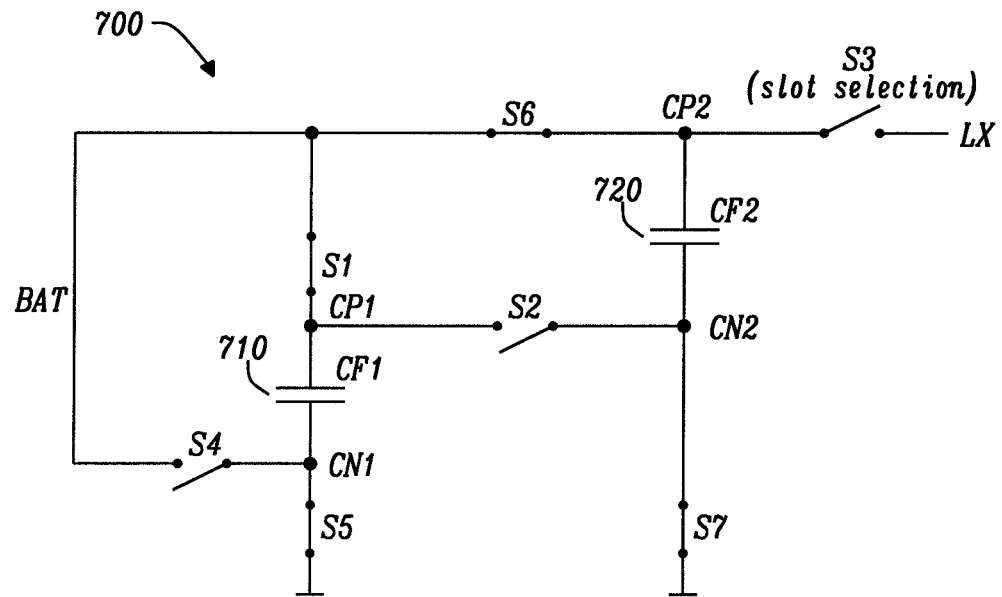
FIG. 7 is a diagram of a charge pump operating in a 1X mode.

FIG. 7 illustrates the topology of an exemplary charge pump for use with the circuit of FIG. 2. The charge pump 700 includes a first flying capacitor CF1 710 and a second flying capacitor CF2 720. The first flying capacitor CF1 has a first terminal coupled to a node CN1 and a second terminal coupled to node CP1. The node CP1 is coupled to an input voltage or battery voltage VBAT via a first switch S1 and the node CN1 is coupled to VBAT via switch S4. The node CN1 is also coupled to ground via switch S5. The second flying capacitor CF2 has a first terminal coupled to node CN2 and a second terminal coupled to node CP2. The node CN2 is coupled to the node CP1 via switch S2 and the node CN2 is coupled to ground via switch S7. The node CP2 is coupled to the VBAT input via switch S6 and to an output, for instance the switching node LX via a coupling switch S3.

The mode of operation of this charge pump can change between 1 times VBAT, 2 times VBAT and 3 times VBAT, where VBAT is the input voltage provided to the circuit. When the charge pump is operated in the 1 times VBAT, the switches S1, S5, S6, S7 are closed, i.e. switched on and switches S4, S2 are off, i.e. open. The switch S3 may be open or closed depending on whether the output of the charge pump is required at an output. In the 1x mode, the voltage at node CP1 is VBAT and the voltage at node CP2 is also VBAT.

Figure 8:
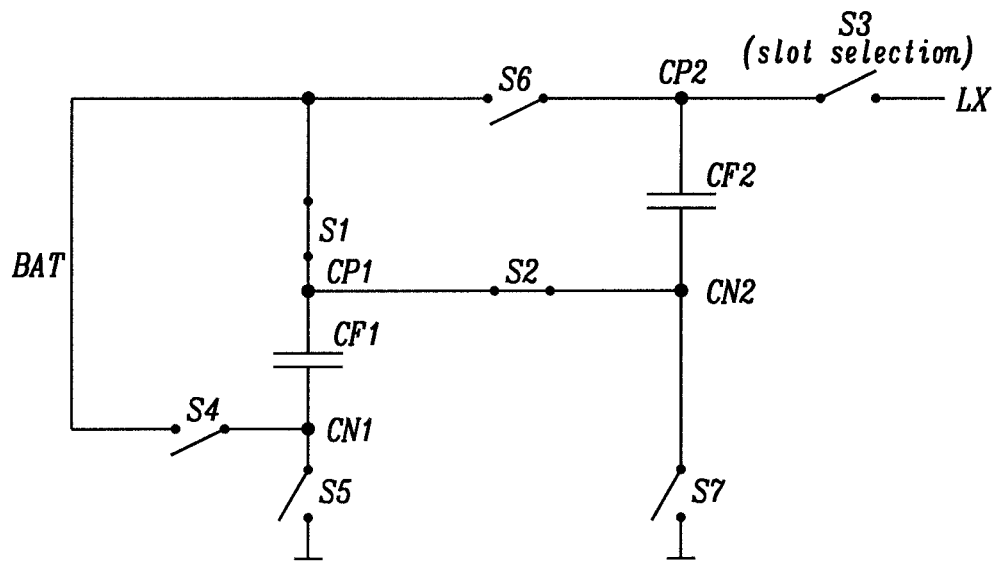
FIG. 8 is a diagram of a charge pump operating in a 2X mode.

FIG. 8 illustrates the operation of the charge pump of FIG. 7, in a 2X mode. In this case, the switches S1, S2 are on, i.e. closed and the switches S4, S5, S6, S7 are off, i.e. open. In this case, the voltage at node CP1 is VBAT, the voltage at node CN2 is VBAT and the voltage at node CP2 is 2 times VBAT.

Figure 9:
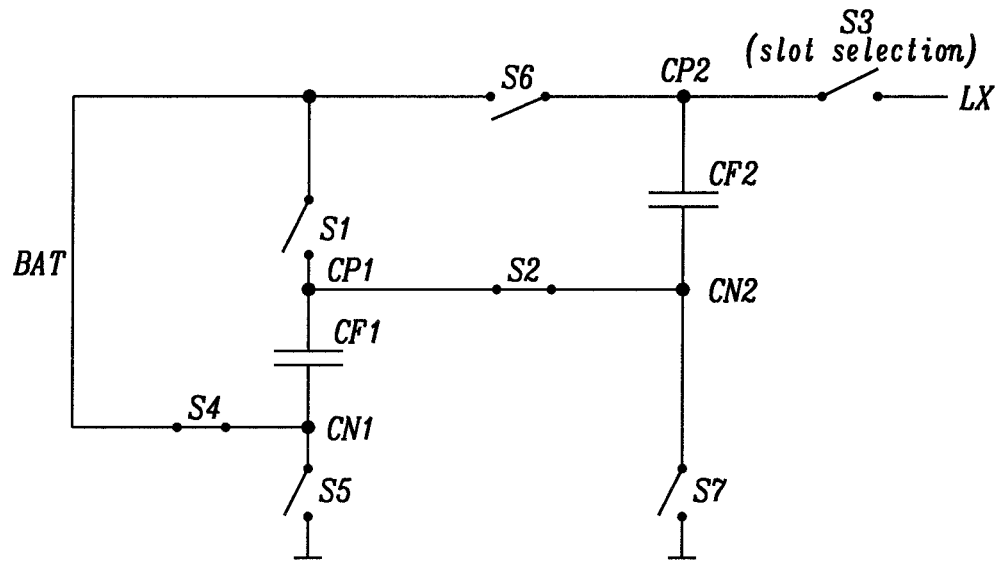
FIG. 9 is a diagram of a charge pump operating in a 3X mode.

FIG. 9 illustrates the state of the switches when operating the charge pump in a 3X mode. In this case, the switches S4, S2 are on, that is closed and the switches S1, S5 and S6 and S7 are turned off, i.e. open. In this scenario, the voltage at node CP1 is 2 times VBAT, the voltage at node CN2 is also 2 times VBAT, and the voltage at node CP2 is 3 times VBAT. Referring to FIG. 2, the decoders 265a, 265b, 265c and 265d provide a set of signals D1a-D7a, D1b-D7b, D1c-D7c, D1d-D7d to operate the switches of the charge pumps CP1, CP2, CP3 and CP4 respectively.

Figure 10:
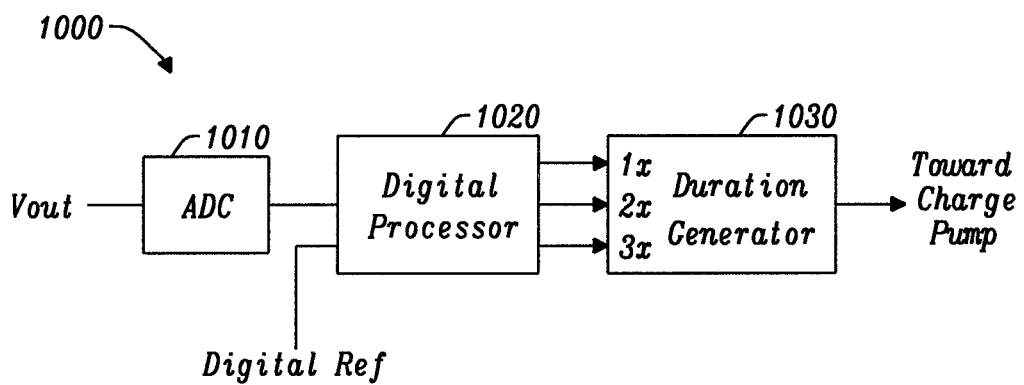
FIG. 10 is a diagram of a digital controller.

FIG. 10 illustrates another controller system for use in the system of FIG. 2. In this case, the controller system has been implemented in digital form.

The system 1000 includes an analog to digital converter ADC 1010, a digital processor 1020 and a duration generator 1030.

In operation the output voltage Vout is received by the analog digital converter 1010 which generates a digital output to the digital processor 1020. The digital processor 1020 compares the digital value with a digital target reference to identify a particular sequence of modes to operate a charge pump coupled to the inductor. The digital processor 1020 provides a set of output signals associated with the identified sequence. The duration generator provides a set of control signals for operating the charge pump in the 1X mode for a duration T1, 2X mode for a duration T2 and 3X mode for a duration T3 according to the sequence.

A skilled person will appreciate that variations of the disclosed arrangements are possible without departing from the disclosure. For instance, it will be appreciated that although the charge pump circuit has been described with four charge pumps, more charge pumps could be provided. Also, different types of charge pumps may be used. Accordingly, the above description of the specific embodiment is made by way of example only and not for the purposes of limitation. It will be clear to the skilled person that minor modifications may be made without significant changes to the operation described.

What is claimed is:

1. A power converter for providing an output voltage, the power converter comprising
   an inductor;
   a charge pump circuit comprising a plurality of charge pumps, each charge pump being selectively coupled to the inductor via a coupling switch, and wherein each charge pump is operable in at least three modes, each mode being associated with a different conversion ratio; and
   a controller adapted to provide a first set of control signals to control the coupling switches, wherein the first set of control signals is configured to couple each charge pump to the inductor sequentially over a period of the control signals, and a second set of control signals to operate the charge pump circuit, wherein the second set of control signals is configured to operate a charge pump coupled to the inductor with a sequence of modes.

2. The power converter as claimed in claim 1, wherein the controller is adapted to compare the output voltage with a target value to define the sequence of modes.

3. The power converter as claimed in claim 1, wherein the first set of control signals comprises a plurality of logic signals; each logic signal having a first logic state for coupling the charge pump to the inductor and a second logic state for disconnecting the charge pump from the inductor; wherein the first logic state lasts for a time duration.

4. The power converter as claimed in claim 3 wherein each logic signal in the plurality of logic signals is delayed by a delay value.

5. The power converter as claimed in claim 3, wherein the second set of control signals is adapted to operate the charge pump coupled to the inductor with the sequence of modes during the time duration.

6. The power converter as claimed in claim 1, wherein the second set of control signals is adapted to operate one or more charge pumps in a specific mode when the one or more charge pumps are not coupled to the inductor.

7. The power converter as claimed in claim 1, wherein the second set of control signals is configured to operate each charge pump, when coupled to the inductor, with the same sequence of modes.

8. The power converter as claimed in claim 3, wherein the logic signals in the first set of control signal have the same duty cycle and are shifted with respect to each other, such that a first logic state of a first logic signal overlaps partially with a first logic state of a second logic signal.

9. The power converter as claimed in claim 2, wherein the controller is adapted to generate an error signal by comparing the output voltage with the target value, to compare the error signal with a first reference signal and a second reference signal respectively; and to generate the second set of control signals based on the comparison.

10. The power converter as claimed in claim 9, wherein each of the first reference signal and the second reference signals has a triangular shape.

11. The power converter as claimed in claim 9, comprising
    an error amplifier for generating the error signal;
    a ramp generator configured to generate the first reference signal and the second reference signal;
    a first comparator adapted to compare the error signal with the first reference signal and to generate a first comparison signal;
    a second comparator adapted to compare the error signal with the second reference signal and to generate a second comparison signal;
    a decoder system coupled to the first and second comparators, the decoder system being configured to generate the second set of control signals based on the first comparison signal and the second comparison signal.

12. The power converter as claimed in claim 1, wherein each mode in the sequence of modes lasts for a corresponding mode duration.

13. The power converter as claimed in claim 12, wherein the controller is a digital controller comprising a duration generator for calculating the mode durations associated with each mode in the sequence of modes.

14. The power converter as claimed in claim 1, wherein the charge pump circuit comprises a plurality of direct charge pumps or Dickson charge pumps.

15. The power converter as claimed in claim 1, wherein the charge pump circuit comprises at least three charge pumps coupled in parallel.

16. A method of providing an output voltage, the method comprising
    providing an inductor;
    providing a charge pump circuit comprising a plurality of charge pumps, each charge pump being selectively coupled to the inductor via a coupling switch, and wherein each charge pump is operable in at least three modes each mode being associated with a different conversion ratio;
    providing a first set of control signals to control the coupling switches, wherein the first set of control signals is configured to couple each charge pump to the inductor sequentially over a period of the control signals; and
    providing a second set of control signals to operate the charge pump circuit, wherein the second set of control signals operates a charge pump coupled to the inductor with a sequence of modes.

17. The method as claimed in claim 16 comprising the step of comparing the output voltage with a target value to define the sequence of modes.

18. The method as claimed in claim 16, wherein the sequence of modes is defined by a plurality of mode values to be applied at a certain time and for a certain duration.

19. The method as claimed in claim 16, wherein the second set of control signals operates each charge pump, when coupled to the inductor, with a same sequence of modes.

* * * * *